United States Patent [19]

Cobaugh et al.

[11] 4,241,381
[45] Dec. 23, 1980

[54] BUS BAR ASSEMBLY FOR CIRCUIT CARDS

[75] Inventors: Robert F. Cobaugh, Elizabeth; Attalee S. Taylor, Palmyra, both of Pa.

[73] Assignee: AMP Incorporated, Harrisburg, Pa.

[21] Appl. No.: 27,130

[22] Filed: Apr. 4, 1979

[51] Int. Cl.³ .............................................. H05K 1/18
[52] U.S. Cl. .................................. 361/413; 361/394; 361/407; 361/415; 339/17 M; 339/22 B; 339/176 MP
[58] Field of Search ............... 361/415, 407, 413, 394; 339/17 M, 22 B, 176 MP

[56] References Cited

U.S. PATENT DOCUMENTS

| | | | |
|---|---|---|---|
| 3,147,404 | 9/1964 | Sinner | 339/192 |
| 3,470,421 | 9/1969 | Shore | 361/407 X |
| 3,475,657 | 10/1969 | Knowles | 361/413 |
| 3,725,843 | 4/1973 | Johnson | 361/407 X |
| 3,746,932 | 7/1973 | Hogan | 361/413 |
| 3,778,681 | 12/1973 | Wilson | 361/413 |
| 3,992,686 | 11/1976 | Canning | 361/413 X |
| 4,106,076 | 8/1978 | Miller | 361/394 |
| 4,155,109 | 5/1979 | Finch | 361/413 |
| 4,164,362 | 8/1979 | Cobaugh et al. | 361/415 X |

Primary Examiner—Richard R. Kucia
Attorney, Agent, or Firm—Gerald K. Kita

[57] ABSTRACT

Power bus bars and ground return bus bars of relatively massive sizes are incorporated into high speed electronic circuitry provided on a large number of circuit cards which are coupled to the power and ground return bus bars with minimized millivolt resistance losses and reactance losses.

17 Claims, 8 Drawing Figures

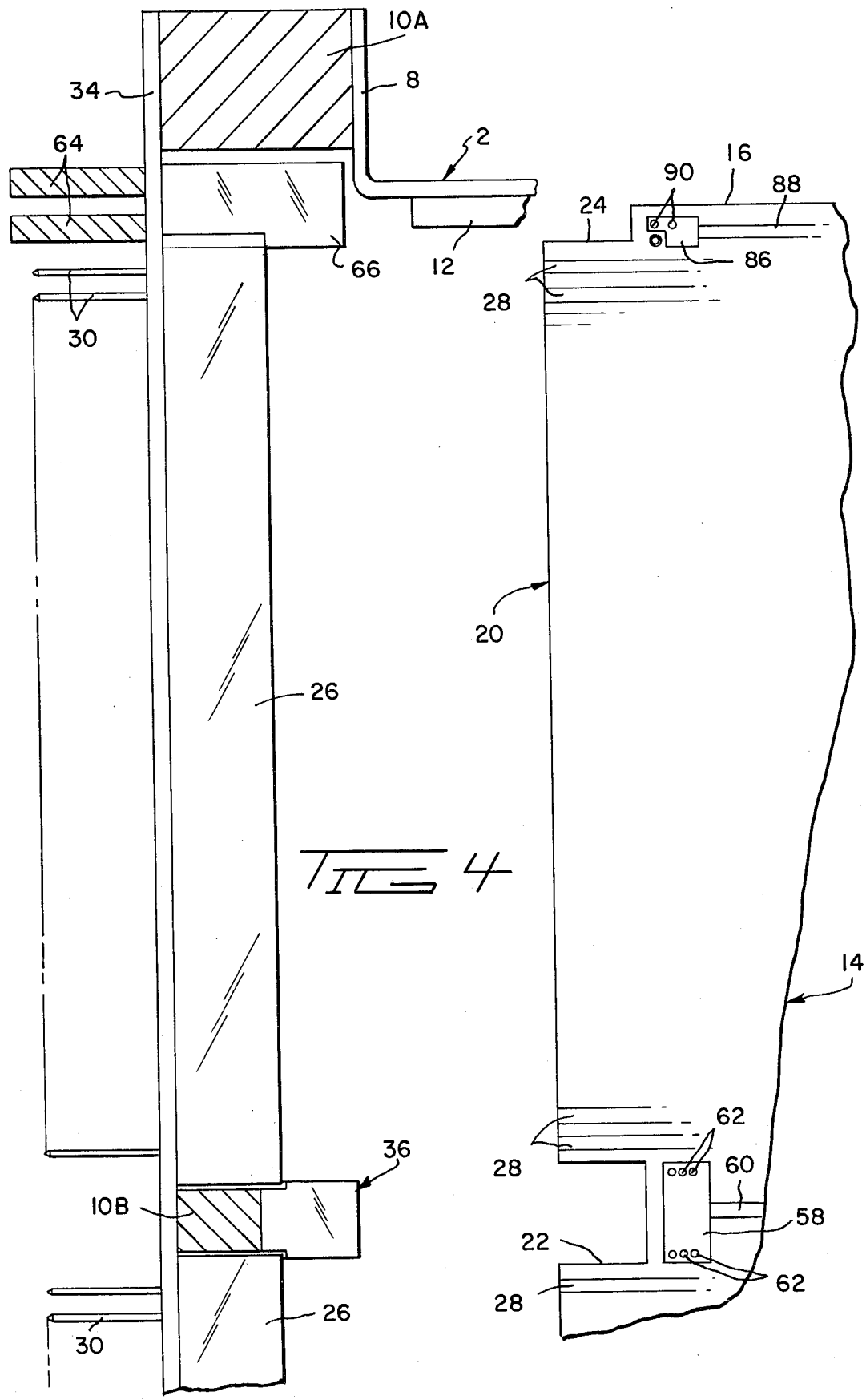

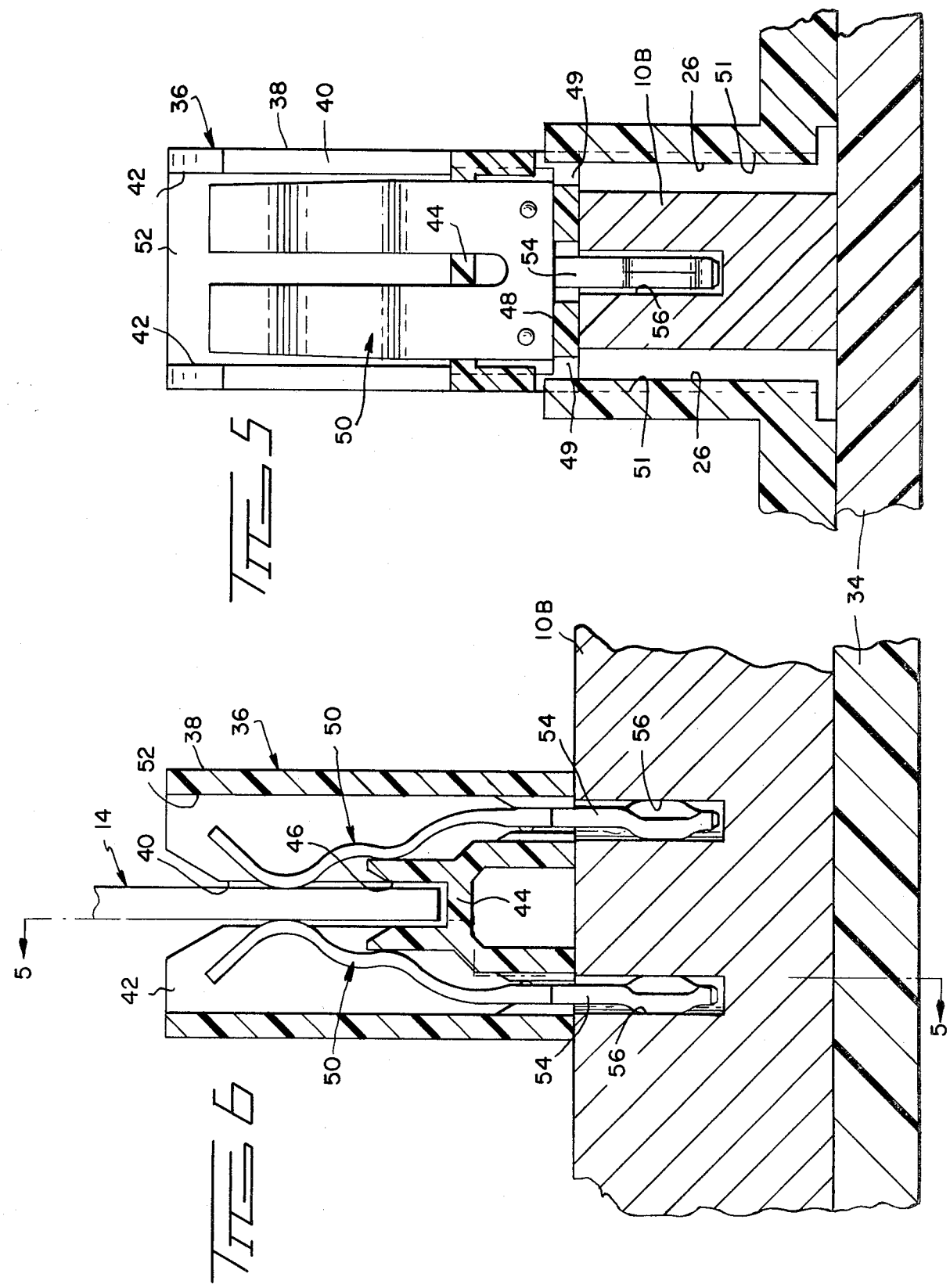

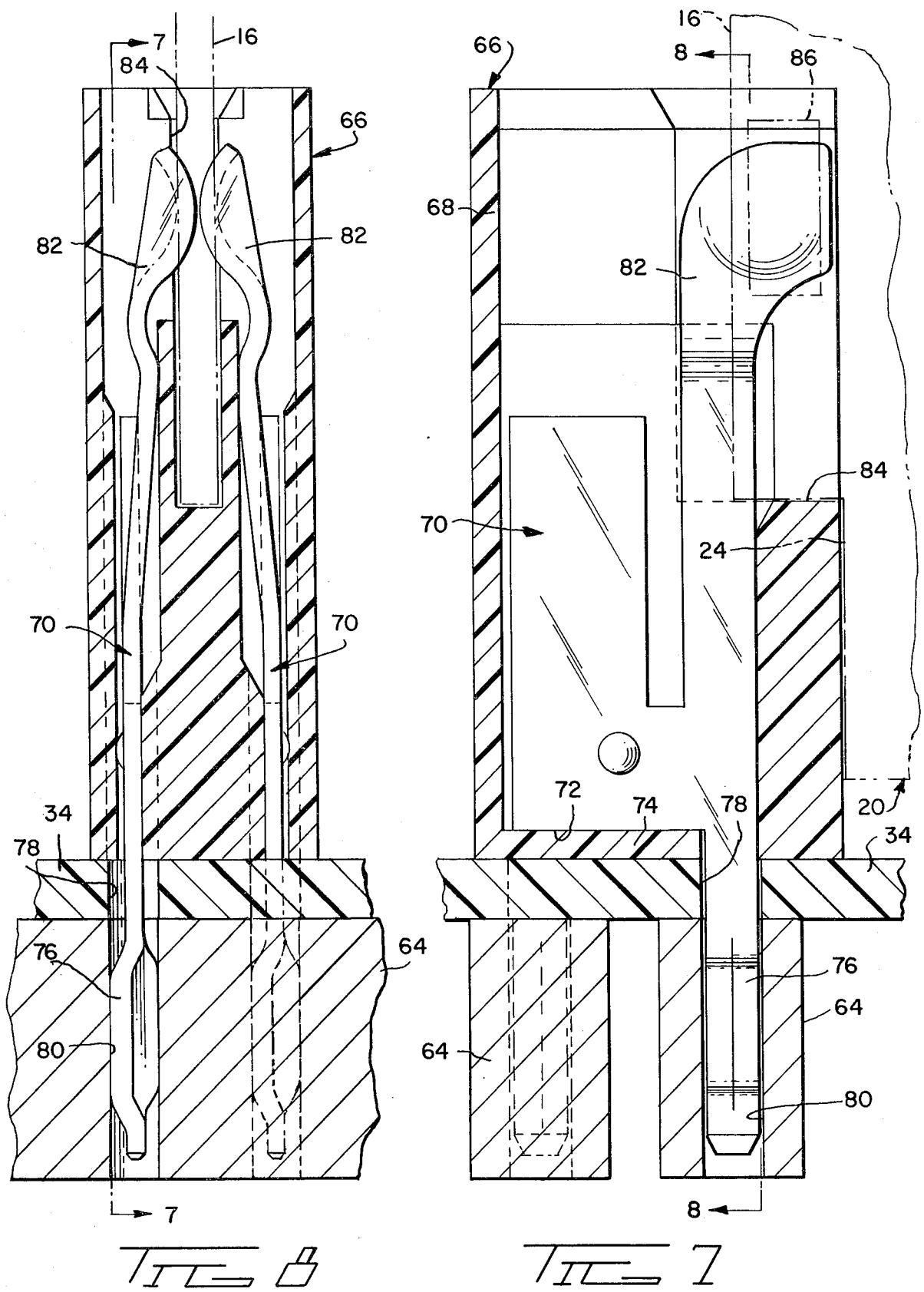

BUS BAR ASSEMBLY FOR CIRCUIT CARDS

FIELD OF THE INVENTION

The present invention relates to a circuit card interconnection assembly having a base circuit board on which are mounted one or more rows of card edge connectors. An array of circuit cards are plugged edgewise into the card edge connectors. The base circuit board is supported on a frame or chassis which also supports channel-shaped tracks, called card guides. Opposite side edges of the circuit cards are supported and guided by the card guides as the circuit cards are plugged into the card edge connectors. The field of card edge connectors and electrical terminals thereof, are represented by the following U.S. Pat. Nos: 3,533,045; 3,601,782; 3,725,843; 3,905,665; 3,977,075; 4,133,592; and 4,077,688.

BACKGROUND OF THE INVENTION

High speed electronic components, such as semiconductor chips, are mounted on the front and back surfaces of planar circuit cards. Circuit paths, plated on the surfaces of the cards, electrically interconnect the components. Often there occurs a lack of surface area available for plating. Hence, each circuit card may be a multilayer circuit card in which a number of planar laminates, each carrying plated circuit paths, are laminated together. Electrical interconnections to the circuit paths internally of the laminates are made by plated through holes, holes which are drilled through the laminates and lined with plating which electrically joins circuit paths intercepted by the holes.

Plated circuits of each card are provided with pads, plated enlarged areas, on front and back surfaces adjacent one edge of the card which is to be plugged into a card edge connector. Electrical card edge terminals within the card edge connector frictionally engage the pads. The card edge terminals are secured in the base circuit board and may be electrically joined to plated circuit paths on the base circuit board. Additionally, the card edge terminals may include elongated post portions which project through the base circuit board to its opposite side for receiving wrapped wire connections.

Each card in an array of card edge connectors must be supplied with electrical power and ground return circuits. This can be accomplished by bus bars extending over the surface of the base circuit board, as shown in U.S. Pat. No. 3,725,843. As the number of circuit cards to be supplied by the bus bar increases, and as the density of circuit components on each card increases, the amount of current drawn from each bus bar increases accordingly. For example, in a typical large interconnection assembly, a large number of circuit cards will draw a cumulative total of 200 Amps or more from each bus bar. Each bus bar must have a cross section which is very large, in excess of an AWG #2 wire size, to provide adequate current carrying capacity. This requirement for size obviates the use of a bus bar which is stamped and formed from relatively thin metal strip. This requirement also eliminates incorporation of the bus bar into a card edge connector, since the sizes of and spacing between the card edge terminals in the connector are very small, in the order of one-tenth to one-sixteenth inches.

The high current carried by the bus bars, as well as voltage losses along with inductance effects of the bus bars would adversely affect the low signal voltages carried by the card edge terminals. Therefore, each bus bar must be isolated from, rather than incorporated into, the card edge connectors.

In the large interconnection assembly, connections for the multiple circuit cards are distributed along a bus bar and will cause a cumulative power drain and voltage drop. If conductors are interposed between the bus bar and each circuit card, additional voltage drops will occur due to contact resistances and bulk resistances of these conductors. Therefore, bus bar interconnections must compensate for cumulative power drain and must be designed for minimizing voltage drops due to additional resistance effects. Additional voltage losses are attributable to inductance effects. Voltage inductance losses are directly proportional to the rate of change of signal and the inductances of the bus bar and the conductors interposed between the bus bar and each circuit card. The rise times of the digital signals which are operative in each circuit card are measured in nanoseconds or fractions of nanoseconds. These short rise times will produce significant millivolt inductance drops. Therefore, bus bar interconnections must be designed for minimum millivolt reactance losses.

SUMMARY OF THE INVENTION

The present invention provides a circuit card interconnection assembly with power bus bars and ground return bus bars of relatively massive sizes and incorporated into high speed electronic circuitry carried on a large number of circuit cards which are coupled to the power and ground return bus bars with minimized millivolt resistance losses and reactance losses. The bus bars are physically separate from card edge connectors of the assembly. The bus bars further are isolated electrically from the card edge contacts and those circuit paths of the assembly of circuit cards which would be adversely affected by the high current carried by the bus bars. The capacitive losses can also be controlled by choosing proper spacing between adjacent power and ground busses. The total net power loss is a sum of the resistive loss, the inductance loss, and the capacitance loss. With this system, all of these losses are considered and compensated for.

The power bus bars of the present invention are positioned on a side of the base circuit board opposite the side on which the card edge connectors are mounted. The ground return bus bars may be supported directly against the base circuit board to support the same against warpage or bowing. Both the power and ground return bus bars are connected to individual circuit cards by connector modules. Each module comprises one or more electrical bus bar contacts in an insulating housing, which is mounted on the base circuit board and which isolates the bus bar contacts from the card edge terminals of the card edge connectors. Each bus bar contact passes freely through the base circuit board and is secured to a corresponding power bus bar. Each bus bar contact is relatively large in cross section and relatively short in length to provide a short and direct route from the bus bar to a corresponding circuit card. This direct routing technique provides less millivolt losses than either a lengthy conductor, or multiple conductors, intervening between the bus bar and each circuit card. A single bus bar contact dimensioned according to the present invention produces less millivolt loss due to contact resistance and bulk resistance than does a lengthy conductor or multiple conductors intervening between the bus bar and each circuit card.

It is therefore an object of the present invention to provide a circuit card interconnection assembly utilizing power bus bars and bus bar contacts which minimize millivolt resistance losses and reactance losses.

Another object of the present invention is to provide a circuit card interconnection assembly which incorporates bus bars of high current carrying capacity and low millivolt losses due to resistance and reactance effects.

Another object of the present invention is to provide a circuit card interconnection assembly wherein power bus bars are connected directly to circuit cards by bus bar contacts which are separate from card edge connectors, and which connect directly to power bus bars on an opposite surface of the base circuit board with minimal voltage resistance losses and voltage reactance losses.

Another object of the present invention is to provide a circuit card interconnection assembly wherein power bus bars and power return bus bars connect directly to multiple circuit cards by relatively massive bus bar contacts separate from card edge connectors, with the assembly being removable from the ground return bus bars which serve to mount the assembly to a chassis.

Another object of the present invention is to provide power bus bars and ground return bus bars of relatively massive sizes incorporated into high speed electronic circuitry carried on a large number of circuit cards which are coupled to power and ground return bus bars with minimum millivolt losses due to resistance and reactance effects.

DRAWINGS

FIG. 1 of the drawings is a perspective of a circuit card interconnection assembly.

FIG. 4 is a diagrammatic view of the selected parts shown in FIG. 3.

FIGS. 5 and 6 are enlarged elevations in section of ground return modules of the selected parts shown in FIG. 3.

FIGS. 7 and 8 are enlarged elevations in section of the power bus modules of the selected parts shown in FIG. 3.

DETAILED DESCRIPTION

Figure 1:
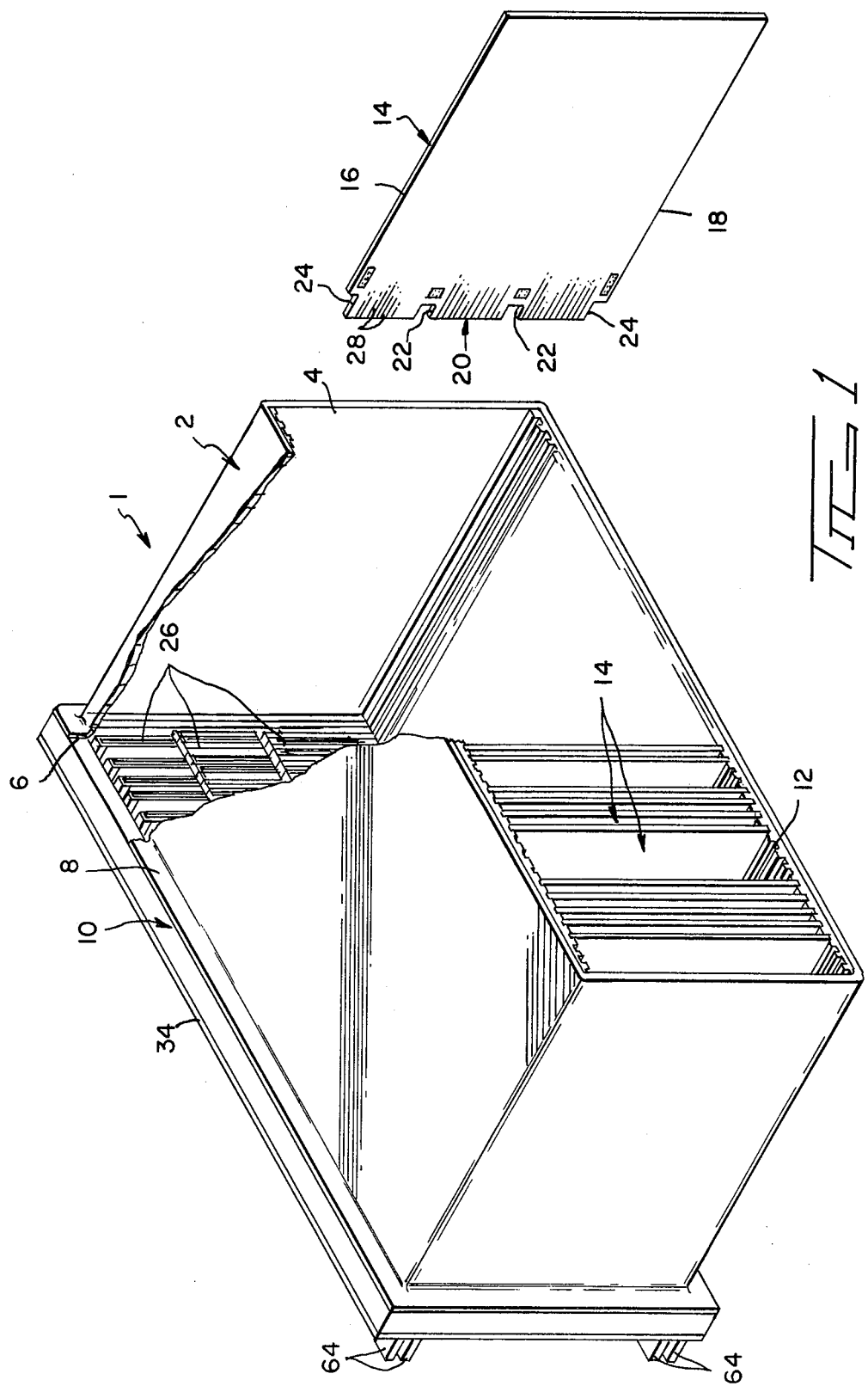
Figure 2:
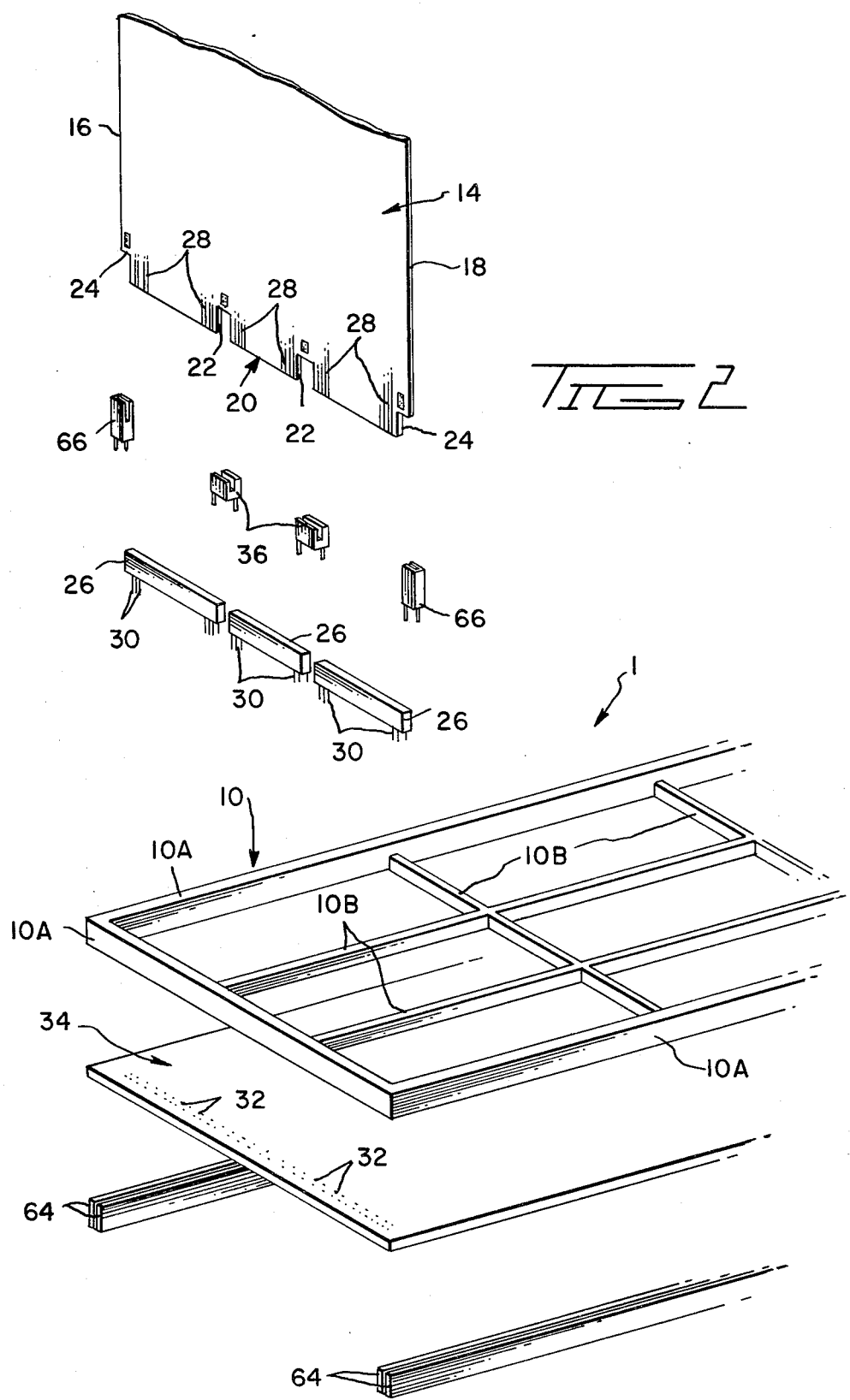
FIG. 2 is a fragmentary exploded perspective of the assembly shown in FIG. 1.

With more particular reference to FIGS. 1 and 2, a circuit card interconnection assembly is shown generally at 1 and comprises a chassis 2 in the form of a metal, four-sided box having an open end 4 and an opposite open end 6 which is encircled by a lip flange 8. The lip 8 is secured, such as by screws (not shown), to a framework 10, fabricated of a conductor such as aluminum or copper, and comprising outer frame elements or bars 10A and secondary or intermediate frame elements or bars 10B bridging between the bars 10A. The top and bottom sides of the box are provided with groove tracks in the form of card guides 12. Generally rectangular multilayer circuit cards 14 are removably inserted into the open end 4 of the chassis 2 with their top and bottom edges 16 and 18 respectively slidably received and supported in corresponding upper and lower groove tracks of the card guides. The card 14 also may be double sided. One side edge 20 of each circuit card 14 includes a series of rectangular cut outs or notches 22 and 24 which divide the edge 20 into three elongated coplanar segments. The coplanar segments of the edge 20 are inserted pluggably into interior cavities of elongated card edge connectors 26, which are well-known and comprise dielectric housings having rows of electrical contacts on either side of an elongated opening into which a card edge, such as the card edge 20, is received. The rows of contacts frictionally engage plated circuit pads such as the plated pads 28 provided on each card 14 on both surfaces thereof along the edge 20. The card edge terminals of the card edge connectors 26 will frictionally engage and thereby electrically contact the pads 28. The card edge terminals have depending post portions, such as the posts 30, shown in FIG. 2, which plug into apertures 32 provided in a planar base circuit board 34. The card edge connectors thereby are mounted on the base circuit board 34, such that a plurality of circuit cards 14 are removably assembled perpendicular to a surface of the base circuit board 34, with the side edges 16 and 18 of the cards slidably supported in the groove tracks of card guides 12. The base circuit board 34 may be provided with plated electrical paths interconnecting selected post portions 30 of the card edge connectors 36, so that the circuit cards 14 are electrically interconnected with one another. The post portion 30 also may project through the base circuit board 34 to an opposite side for receiving wrapped wire connections. These electrical interconnections among the circuit cards 14 transmit low voltage level signals at high speed, to and from electronic components, such as semi-conductor chips mounted on the front and back surfaces of the circuit cards 14. These signals are typically of low voltage, for example, one volt or five volts. These voltages must remain constant to assure correct operation of the electronic components. As a result, these voltages can not suffer losses even as small as millivolts. Electrical power and ground return must be supplied to each of the circuit cards. The power drain, particularly when there are a large number of electronic components on a large number of cards, will cause voltage losses from a power supply and from the electrical connections from the power supply to each card. The present invention provides a bus bar assembly for the circuit cards which will compensate for these voltage losses. Additional voltage losses are due to contact resistances and bulk resistances of conductors comprising the bus bar assembly between the power supply and each circuit card 14. Accordingly, the bus bar assembly of the present invention will compensate for and will minimize these additional voltages losses.

The digital signals transmitted among the circuit components of the circuit cards 14 operate at high speed. The rise times of these digital signals are measured in nanoseconds or fractions of nanoseconds. These short rise times will produce significant millivolt inductance losses, since these losses are directly proportional to the rate of change of signal, and to the inductances and capacitances of the conductors comprising the bus bar assembly. Therefore, the bus bar assembly according to the present invention is designed for minimum millivolt reactance losses. The bus bar assembly of the present invention is isolated electrically from the digital signal circuitry of the circuit card assembly to avoid adverse effects from cross talk and the high current carried by the bus bar assembly.

Figure 3:
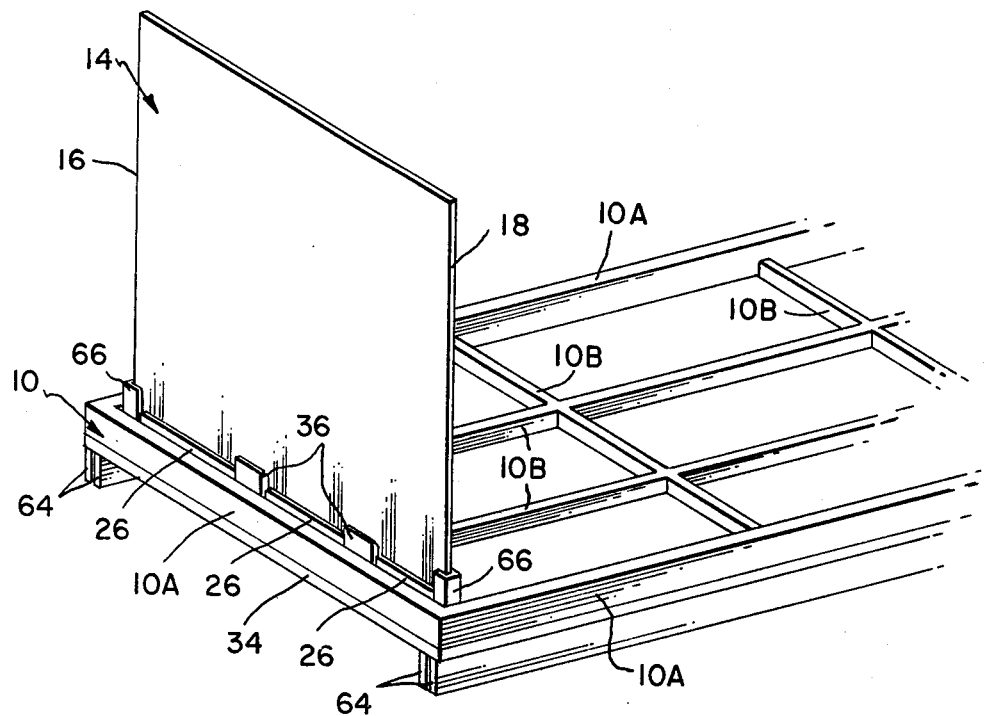
FIG. 3 is a fragmentary perspective illustrating selected parts of the assembly shown in FIG. 1.

FIGS. 2 and 3 illustrate the base circuit board 34 assembled to the framework 10, for example, by screws (not shown). The framework stiffens and supports the board 34 from warpage distortion and deflection when one or more cards 14 are forcefully inserted into the card edge connectors 26. The card edge connectors 26 are disposed in the spaces between the secondary bars 10B. The cut outs 22 of each circuit card 14 provide clearances for corresponding bars 10B. It is contemplated that the circuit cards 14 may be removed from the chassis 2, and that the base circuit board 34 may be removed, together with the card edge connectors 26, from the assembly of the frame 10 and the chassis 2, in order to make modifications or repairs to the circuitry. The framework 10 is utilized as a ground return bus bar assembly. FIGS. 4, 5 and 6 illustrate a direct connection of each circuit card 14 with a bar 11B by use of a ground return connector module 36 which fits into a corresponding cut out 22 of a circuit card 14 when pluggably inserted into the card edge connectors 26. FIGS. 5 and 6 illustrate details of each connector module 36, comprising an insulative molded housing 38 having a central slotted opening 40 receiving a portion of a circuit card 14 simultaneously as the circuit card is pluggably inserted into the card edge connectors 26. The slotted opening 40 is provided through opposite outer side walls 42 of the housing 38. An internal web 44 integrally joins and bridges between the walls 42 and is provided with a slotted recess 46 in alignment with the opening 40. The web 44 receives and supports a corresponding card 14. The web 44 also is molded integral with a bottom wall 48 of the housing 38 which registers against a corresponding bar 11B. A pair of relatively thick, stiffly resilient metal strip contacts 48 are provided on either side of the slotted opening 40. Each terminal 50 is inserted through an open top 52 of the housing 38 with a base portion of each terminal in registration against the bottom wall 48. A depending post portion 54 of each terminal 50 is wedged into drilled recesses 56 provided in a corresponding bar 11B. For example, each post portion 54 is bifurcated into a pair of depending leg portions which frictionally wedge against each other and against the confines of the recesses 56 to assure good mechanical and electrical connection with a corresponding bar 11B. Such connections are the sole means for maintaining the contacts and the connector housing 38 in place.

With reference to FIGS. 4, 5, and 6, the upper portion of each terminal 50 is bifurcated to form a pair of cantelever blades which frictionally engage a plated ground return pad 58 provided on opposite surfaces of a corresponding circuit card 14 adjacent a cut out 22. Each pad 58 is joined with a ground return circuit path 60 on a respective outer surface of the circuit card 14. Plated through holes 62 electrically join the pads 58 to ground return circuit paths on the internal laminates of the circuit card 14. Each circuit card 14 is connected directly to a ground return bus bar 11B by a relatively short and direct route. Each ground return terminal 50 is relatively large in cross-section and short in length to minimize millivolt resistance losses and reactance losses. Each connector module 36 is permanently mounted to the framework yet allows removal of the base circuit board from the framework and removal of individual circuit cards 14 from the assembly. The ground return connector modules 38 electrically isolate the ground return circuit from the card edge connectors 26.

FIG. 5 illustrates the housing 38 being open along the intersection of each wall 42 with the bottom wall 48 to allow for passage of fan-forced cooling air over the terminals 50. A web 49 joins each wall 42 with the bottom wall 48. Each web 49 interfits within a groove 51 provided vertically in the end of a corresponding card edge connector 26, so that the connector module 36 is precisely positioned and stablized in alignment with adjacent card edge connectors 26.

FIGS. 1, 2, 3 and 4 illustrate rectangular power bus bars 64 supported against a side of the base circuit board 34 on a surface opposite the surface on which the card edge connectors 36 are mounted. The bus bar 64 support and prevent warpage distortion of the base circuit board. The bus bars 64 are arranged in pairs, with one bus bar supplying, for example, a five volt power input to each card 14, and with the other supplying current at one volt to each card 14. Each pair of bus bars is separated by a dielectric air gap or, alternatively, by a solid dielectric to control cross capacitance.

FIGS. 4, 7 and 8 illustrate power bus bar connector modules 66 for connecting the bus bars to the circuit cards 14. FIGS. 7 and 8 illustrate each connector module 66 as comprising a molded dielectric housing 68 containing a pair of relatively massive, power bus bar terminals 70 which are formed from relatively thick and stiffly resilient metal stock. Each terminal has a planar base portion 72 in registration against a planar bottom wall 74 of the housing 68. A projecting post portion 76 of each teminal 70 projects through the bottom wall 74 and freely through a slightly over-sized aperture 78 provided through the base circuit board 34. The post portion 76 of each terminal 70 is bifurcated into a pair of leg portions frictionally wedged against each other and against the sides of a drilled opening 80 provided in a corresponding bus bar 64. Each post 76 thereby is mechanically and electrically secured to a bus bar 64 and is the sole means for supporting and assembling the connector module 66 and the bus bars 64 to the base circuit board 34. Each terminal 70 includes an elongated cantelever spring blade portion 82 in vertical alignment with a vertical slotted opening 84 in each housing 68. As shown in FIGS. 4, 7 and 8, each connector module 66 is received along a corresponding cut out 24 of a circuit card 14 as the circuit card is inserted into the card edge connectors 26. A side edge 16 of each card adjacent a corresponding cut out 24 will register within a corresponding slotted opening 84 and in between a pair of blade portions 82. Each circuit card 14 is provided with plated power bus pads on both sides thereof adjacent to each cut out 24. Each pad 86 is frictionally engaged by a corresponding blade portion 82 and is connected to plated power circuit paths 88. Each pad 86 is provided with plated through holes 90 which connect each pad 86 to additional power circuit paths of internal laminating in each corresponding circuit card 14. Each bus bar 64 is connected to a pad 86 on one side of each circuit card 14 by a corresponding terminal 70. Each terminal 70 provides a relatively short and direct connection of a bus bar to a circuit card with a minimum of bulk resistance. Contact resistance is minimized by a minimum number of two connections, one to the bus bar and one to the circuit card. The cross section of each bus bar terminal 70 is large relative to its short length, so that the inductance thereof is minimized. As a result, voltage inductance losses attributed to the high speed signals, which draw power from the bus bars, also are minimized. The bus bars 64 advantageously supply current and different voltage levels to opposite sides of individual circuit cards 14. The bus bars 64 are isolated electrically from the signal circuits of the individual cards and from the circuits on the base circuit board 34. The bars 64 are separate from the card edge connectors and may be fabricated of highly conductive copper with relatively massive cross sections to provide adequate current capacity and to compensate for cumulative power drain by the individual cards 14. The direct and relatively short route to each individual card 14 minimizes millivolt losses due to contact resistances and bulk resistances of the interposed terminals 70.

Although a preferred embodiment of the present invention is disclosed, other embodiments and modifications which would be apparent to one having ordinary skill in the art are intended to be covered by the spirit and scope of the appendent claims.

What is claimed is:

1. In a power distribution system for multiple circuit cards inserted removably into card receiving openings of card edge connectors, which are mounted on a surface of a circuit board, and which contain signal carrying electrical terminals constructed for electrical engagement with the circuit cards, the improvement comprising:

one or more conductive power bus bars and conductive ground return bus bars extending along said circuit board, and relatively massive contact terminals directly connecting said circuit cards and said bus bars, said contact terminals being externally of and aligned with respective said card edge connectors to contact respective said circuit cards inserted into said card receiving openings, said contact terminals being connected to respective said bus bars by post portions of said contact terminals force fitted into openings of respective said bus bars.

2. The structure as recited in claim 1, and further including; ground return connector modules each having an insulating housing containing respective said contact terminals connected to said ground return bus bars, and power distribution connector modules each having an insulating housing containing respective said contact terminals connected to said power distribution bus bars.

3. The structure as recited in claim 2, wherein each said insulating housing includes a card edge receiving slot, respective said contact terminals in said insulating housings communicating with said slots to engage respective said circuit cards inserted into said slots.

4. The structure as recited in claim 2, wherein said post portions of said contact terminals mechanically assemble respective said power bus bars and said power distribution connector modules to said circuit board.

5. The structure as recited in claim 4, wherein, said circuit board is provided with apertures through which project said post portions of respective said contact terminals for force fitted connection in said openings of said power bus bars.

6. The structure as recited in claim 4, wherein, said power bus bars, respective said power connector modules assembled with said power bus bars and said card edge connectors are removable together with said circuit board from said ground return bus bars.

7. The structure as recited in claim 1, wherein, respective said contact terminals project through said circuit board for force fitted engagement with said power bus bars.

8. The structure as recited in claim 1, wherein said ground return and power distribution connector modules engage respective ends of said card edge connectors.

9. The structure as recited in claim 1, wherein, said ground return bus bars are secured to a chassis provided with card guides which slidably support edges of said circuit cards.

10. The structure as recited in claim 1, wherein, said power bus bars extend along a side of said circuit board opposite a side thereof on which said card edge connectors are mounted, with respective said contact terminals passing through said circuit board and being secured to said power bus bars.

11. The structure as recited in claim 1, wherein, said power bus bars are arranged in pairs, with a dielectric between said power bus bars of each pair, and with a bus bar of each pair being electrically connected to each circuit card by a corresponding said contact terminal.

12. In a power distribution system for multiple circuit cards inserted removably into card receiving openings of card edge connectors, which are mounted on a surface of a circuit board, and which contain signal carrying electrical terminals constructed for electrical engagement with the circuit cards, the improvement comprising:

one or more conductive power bus bars extending along said circuit board, a plurality of insulating power distribution housings on said circuit board and distributed along the length of selected said power bus bars, one or more conductive ground return bus bars extending along said circuit board, a plurality of insulating ground return housings on said circuit board and distributed along the length of selected said ground return bus bars, said card edge connectors having their card receiving opening extending in alignment with at least one of said power distribution housings and at least one of said ground return housings, relatively massive contact means contained respectively in said power distribution housings and said ground return housings and isolated electrically from said signal carrying terminals for electrically connecting at least one said selected power distribution bus bar and also at least one said selected ground return bus bar with said circuit cards inserted into said card receiving openings of said card edge connectors.

13. The structure as recited in claim 12, wherein, said ground return bus bars are secured to a chassis provided with card guides which slidably support edges of said circuit cards.

14. The structure as recited in claim 12, wherein, said power bus bars extend along a side of said circuit board opposite a side thereof on which said card edge connectors are mounted, with said contact terminals passing through said circuit board and being secured to said power bus bars.

15. The structure as recited in claim 12, wherein, said power bus bars are arranged in pairs, with a dielectric between said power bus bars of each pair, and a bus bar of each pair being electrically connected to each circuit card by a corresponding said contact terminal.

16. The structure as recited in claim 12, wherein, said power bus bars, said power distribution housings, said contact terminals in said power distribution housings, and said card edge connectors are removable together with said circuit board from said ground return bus bars.

17. The structure as recited in claim 9, wherein, each of said housings includes a card receiving slot, respective said contact terminals in said housings communicating with said slots to engage respective said circuit cards inserted in said slots.

* * * * *